(12) United States Patent
Spartiotis et al.

(10) Patent No.: US 6,703,617 B1
(45) Date of Patent: Mar. 9, 2004

(54) DEVICE FOR IMAGING RADIATION

(75) Inventors: Konstantinos Evangelos Spartiotis, Espoo (FI); Stefan Jurthe, Espoo (FI); Markku Eraluoto, Espoo (FI)

(73) Assignee: Simage Oy, Espoo (FI)

( * ) Notice: Subject to any disclaimer, the term of this patent is extended or adjusted under 35 U.S.C. 154(b) by 0 days.

(21) Appl. No.: 09/958,923

(22) PCT Filed: Apr. 26, 2000

(86) PCT No.: PCT/IB00/00697
§ 371 (c)(1),
(2), (4) Date: Dec. 20, 2001

(87) PCT Pub. No.: WO00/65376
PCT Pub. Date: Nov. 2, 2000

(65) Prior Publication Data (65)

(30) Foreign Application Priority Data

Apr. 26, 1999 (GB) ............................................... 9909574
Jul. 16, 1999 (GB) ............................................... 9916793

(51) Int. Cl.⁷ ................................................. G01T 1/24
(52) U.S. Cl. ................................................. 250/370.09
(58) Field of Search ........................ 250/370.09, 370.08

(56) References Cited

U.S. PATENT DOCUMENTS

| 5,464,984 | A |   | 11/1995 | Cox et al. | 250/370.11 |
|---|---|---|---|---|---|
| 5,635,718 | A |   | 6/1997 | DePuydt et al. | 250/370.09 |
| 6,403,964 | B1 | * | 6/2002 | Kyyhkynen | 250/370.09 |
| 6,510,195 | B1 | * | 1/2003 | Chappo et al. | 250/370.09 |
| 6,528,794 | B1 | * | 3/2003 | Sato | 250/370.09 |
| 6,539,076 | B1 | * | 3/2003 | Shoji | 250/370.09 |

FOREIGN PATENT DOCUMENTS

| EP | 0 807 976 | 11/1997 |
| EP | 0 933 650 | 8/1999 |
| GB | 2 315 157 | 1/1998 |
| JP | 11-242486 | 9/1998 |
| JP | 11-220656 | 10/1999 |

OTHER PUBLICATIONS

JP 3 083 449 A Shimadzu, Apr. 9, 1991, Abstract Only.

* cited by examiner

*Primary Examiner*—Christopher W. Fulton
(74) *Attorney, Agent, or Firm*—Kenyon & Kenyon

(57) ABSTRACT

A radiation imaging assembly includes a radiation imaging detector (160) including a plurality of image elements from which respective signals may be produced and a plurality of contacts for outputting said signals. A first substrate (154) is provided which comprises first and second major surfaces, said first major surface supporting said radiation imaging detector and providing support contacts for cooperating with respective contacts of said radiation imaging detector when mounted on said first surface. A second substrate for supporting electronic circuitry operable for said imaging device tile is also provided, said second substrate (158) disposed opposing said first substrate, and preferably disposed within the footprint of the first substrate.

15 Claims, 5 Drawing Sheets

PRIOR ART

DEVICE FOR IMAGING RADIATION

This invention relates to an imaging device assembly for imaging radiation and to an imaging system including such an imaging device assembly.

Imaging devices comprising an array of image elements of various types are known.

Charged coupled image sensors (also known as charged coupled devices (CCDs)) form one type of known imaging device. A CCD type device operates in the following way:
1. Charge is accumulated within a depletion region created by an applied voltage. For each pixel (image cell) the depletion region has a potential well shape and constrains electrons under an electrode gate to remain within the semiconductor substrate.
2. Voltage is applied as a pulse to the electrode gates of the CCD device to clock each charge package to an adjacent pixel cell. The charge remains inside the semiconductor substrate and is clocked through, pixel by pixel, to a common output.

During this process, additional charge cannot be accumulated.

Another type of imaging device which is known is a semiconductor pixel detector which comprises a semiconductor substrate with electrodes which apply depletion voltage to each pixel position and define a charge collection volume. Typically, simple buffer circuits read out the electric signals when a photon is photo-absorbed or when ionising radiation crosses the depletion zone of the substrate. Accordingly pixel detectors of this type typically operate in a pulse mode, the numbers of hits being accumulated externally to the imaging device. The buffer circuits can either be on the same substrate (EP-A-0 287 197) as the charge collection volumes, or on a separate substrate (EP-0 571 135) that is mechanically bonded to a substrate having the charge collection volumes in accordance with, for example, the well known bump-bonding technique.

An example of such imaging devices are flat panel sensors using amorphous silicon substrates. In such sensors, a layer of amorphous silicon is grown on a glass substrate. Each radiation sensitive element of the sensor is formed of a photodiode and has an associated thin film transistor (TFT) which acts as a simple switch for the display element to form an active matrix. An X-ray to light converter (scintillator) is placed above the amorphous silicon (a-Si) to produce light, which is detectable in the a-Si layer, corresponding to incident X-rays.

A drawback of such devices is that they have a relatively low X-ray to charge conversion factor and consequently electronic circuitry for amplifying or processing the charge must be placed close to the active screen. However, the glass substrate is unsuitable for supporting the necessary circuitry and hence it is placed around the periphery of the active screen.

A further type of device is described in International Application WO 95/33332. In WO 95/33332, an Active-pixel Semiconductor Imaging Device (ASID) is described. The ASID comprises an array of image elements including a semiconductor substrate having an array of image element detectors and a further array of image element circuits. The image element detectors generate charge in response to instant radiation. Each image element circuit is associated with a respective image element detector and accumulates charge resulting from radiation incident on the image element detector. The image element circuits are individually addressable and comprise circuitry which enables charge to be accumulated from a plurality of successive radiation hits on the respective image element detectors. The device operates by accumulating charge on the gate, for example, of a transistor. Accordingly, analogue storage of the charge value is obtained. At a determined time, the charge from the image element circuits can be read out and used to generate an image based on the analogue charge values stored in each of the image element circuits.

CCD devices suffer from disadvantages of limited dynamic range, due to the limited capacity of the potential well inside the semiconductor substrate, and also to the inactive times during which an image is read out. Pulse counting semiconductive pixel devices also have the disadvantage of limited dynamic range. As these devices read the pixel contact when a hit is detected, they suffer from saturation problems at high counting rates. The semiconductor image element device according to WO 95/33332 provides significant advantages over the earlier prior art by providing a large dynamic range for the accumulation of images.

It has been proposed to utilise the above-mentioned CCD and semiconductor devices to replace the film used in conventional radiation imaging systems, in order to provide real-time imaging and a more controlled lower dosage of radiation for a given exposure.

Conventional radiation imaging system utilise a film cassette 1 for holding the X-ray or high energy radiation sensitive film in place within the imaging system. The X-ray film takes up an area 2 within the cassette and is surrounded by a support area 3, as illustrated in FIG. 1 of the accompanying drawings.

The above-mentioned CCD and semiconductor devices with which it is proposed to replace the film used in conventional radiation bridging systems, are generally supported upon printed circuit boards and have the configuration substantially illustrated in FIG. 2. The CCD or semiconductor device 6 which may include radiation sensitive detectors such as direct-conversion detectors and indirect-conversion detectors, such as a scintillator screen and CCD or a-Si, is supported on printed circuit board 8 and take up an area 10. In the imaging device 6 illustrated in FIG. 2, the imaging area 10 comprises a 3×4 array of image device tiles, such as may be utilised with an ASID as referred to above. Each imaging device tile comprises a plurality of such ASIDs and provides for a mosaicing of a number of tiles in order to provide a relatively large imaging surface area. Optionally, a-Si detectors could be used. The printed circuit board 8 also supports electronic circuitry 13 for providing control signals to the device 6 and reading out signals from the device.

Conventionally, the electronic circuits are provided on the circuit board 8 to the sides of the imaging area 10. An electrical connector 15 is attached to the printed circuit board 8 in order to transfer signals from the electronic circuitry 13 to signal processing electronics elsewhere in the imaging system. The regions 4, 5 shown in broken line indicate areas to which the printed circuit board 8 may be extended to accommodate further electronic circuitry.

Conventionally, as the need for electronic processing of the raw data from the image elements increases, so does the amount of electronic circuitry, 13, provided on the printed circuit board 8. As can be seen from FIGS. 1 and 2, there is a significant amount of wasted, or non-imaging, space on printed circuit board 8 compared to the conventional film cassette. Consequently, imaging devices utilising semiconductor devices take up considerably more surface area and volume than a conventional film cassette having the same imaging surface area. An additional drawback is that semiconductor devices cannot be provided as "slot-in" or "plug-in" replacements for conventional film cassettes. Thus, it is necessary to provide new holders within the imaging radiation systems in order to accommodate CCD-and semiconductor-based radiation detectors.

Examples of imaging devices and systems in which the electronics takes up a significant surface area of the imaging device are the:

dpiX FlashScan 20 system which has an active imaging area of 570 mm×360 mm, yet dimensions of 250×250 mm, and the FlashScan 30 system which has an active imaging area of 293 mm×406 mm, yet dimensions of 500×366 mm; and Trixell pixium 4600 which has an imaging area of 426.3 mm×432 mm, but a distance of 26 mm from the image area to top and bottom sides of the casing and 65 mm from the image area to left and right sides of the casing.

The surface area not used for imaging is generally used for electronic circuitry for processing charge signals from the image detectors.

In accordance with a first aspect of the invention, there is provided a radiation imaging assembly, comprising a radiation imaging detector including a plurality of image elements from which respective signals may be produced and a plurality of contacts; a first substrate comprising first and second major faces, said first major face supporting said radiation imaging detector and providing support contacts for cooperating with respective contacts of said radiation imaging detector mounted on said first surface; and a second substrate for supporting electronic circuitry operable for said radiation imaging detector, said second substrate disposed opposing said second major face of said first substrate.

Preferred embodiments optimise the imaging area of the assembly for a given total surface area taken up by the assembly. Furthermore, necessary electronics for applications such as video imaging may be included in the assembly without increasing, or at least without substantially increasing, the surface area taken up by the assembly as a whole. This provides the opportunity for assemblies to be manufactured which can provide plug-in replacement modules for conventional imaging cassettes or devices such as those using film.

Preferably, the second substrate is disposed confronting said second major face of said first substrate. More preferably said second substrate is disposed substantially within the peripheral boundaries of said second major face of said first substrate. Yet more preferably, said second substrate is disposed substantially within the footprint of said second major face of said first substrate.

Suitably, the second substrate is disposed relative to said first substrate such that at least about 70% of the surface area of said second substrate overlaps the surface area of said second major face of said first substrate. This provides space for circuit board connectors for example. Optionally, if the connector is place projecting from an underside of the second substrate substantially all of the second substrate can overlap the second major surface of the first substrate.

In a preferred embodiment, the radiation imaging detector comprises an imaging device tile including an imaging device comprising a plurality of image elements from which respective signals may be produced and a plurality of contacts at respective tile contact positions on a mounting surface of said tile for at least supply, control and output signals, and said first major face providing support contacts for at least supply, control and output signals for cooperating with respective contacts of said imaging device tile when mounted on said first face.

The second major face supports electronic circuitry operable with said radiation imaging detector or imaging device tile, typically comprises analogue signal processing circuitry.

Suitably, the analogue signal processing circuitry comprises a current to voltage converter for signals from said radiation imaging detector or imaging device tile, and analogue-to-digital conversion couplable to receive signals from said current to voltage converter.

Advantageously, the electronic circuitry supported by said second substrate comprising digital circuitry, and the digital electronic circuitry is adapted to process signals from electronic circuitry supported by said second major face and to provide control and readout signals for control and read out of said imaging device.

Preferably, the first and second substrates are mechanically supported away from each other by means of a circuit to circuit board connector, and optionally supported away from each other by means of a spacer.

In accordance with a second aspect of the invention there is provided, a housing for an assembly as described in any of preceding paragraphs, said housing comprising mechanical support means for said assembly. Preferably, the mechanical support means comprises at least one groove in a side of said housing for receiving an edge of said first or second substrate.

Particular and preferred aspects of the invention are set out in the accompanying independent claims. Combinations of features from the dependent and/or independent claims may be combined as appropriate and not merely as set out in the claims.

Embodiments of the invention will now be described, by way of example only, with reference to the accompanying drawings in which like elements have like reference signs and in which.

Figure 1:
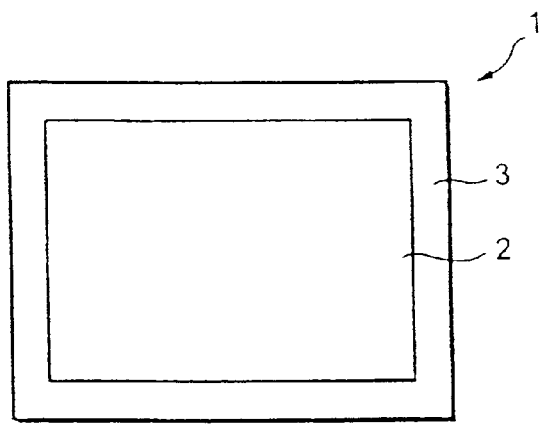
FIG. 1 is a schematic illustration of a conventional X-ray film cassette.
Figure 2:
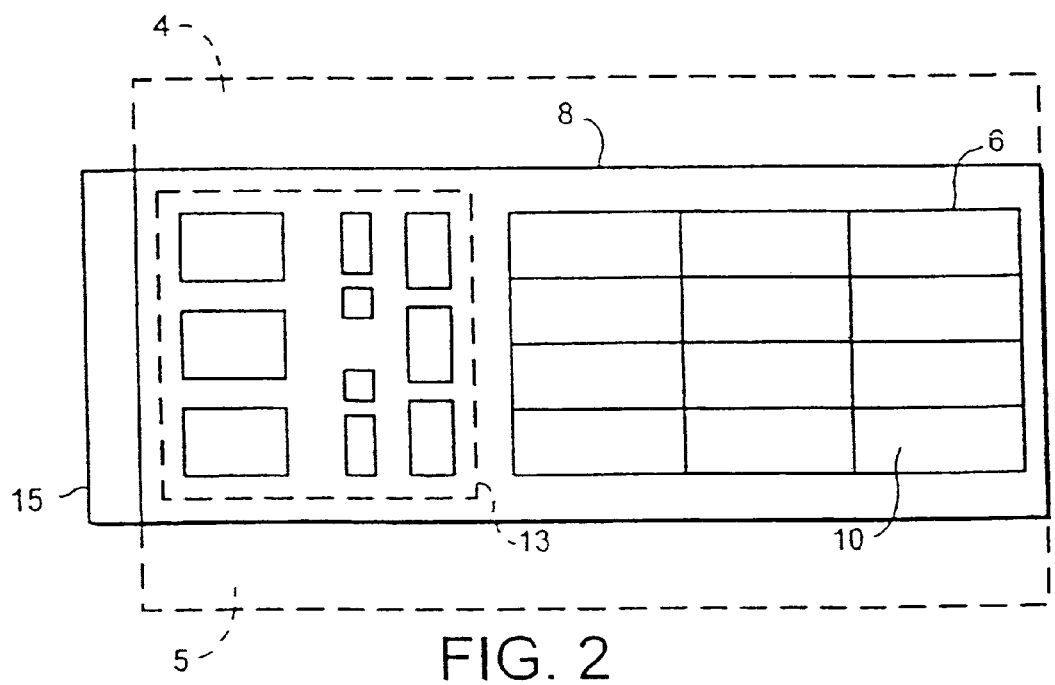
FIG. 2 is a schematic illustration of a semiconductor imaging circuit board.
Figure 3:
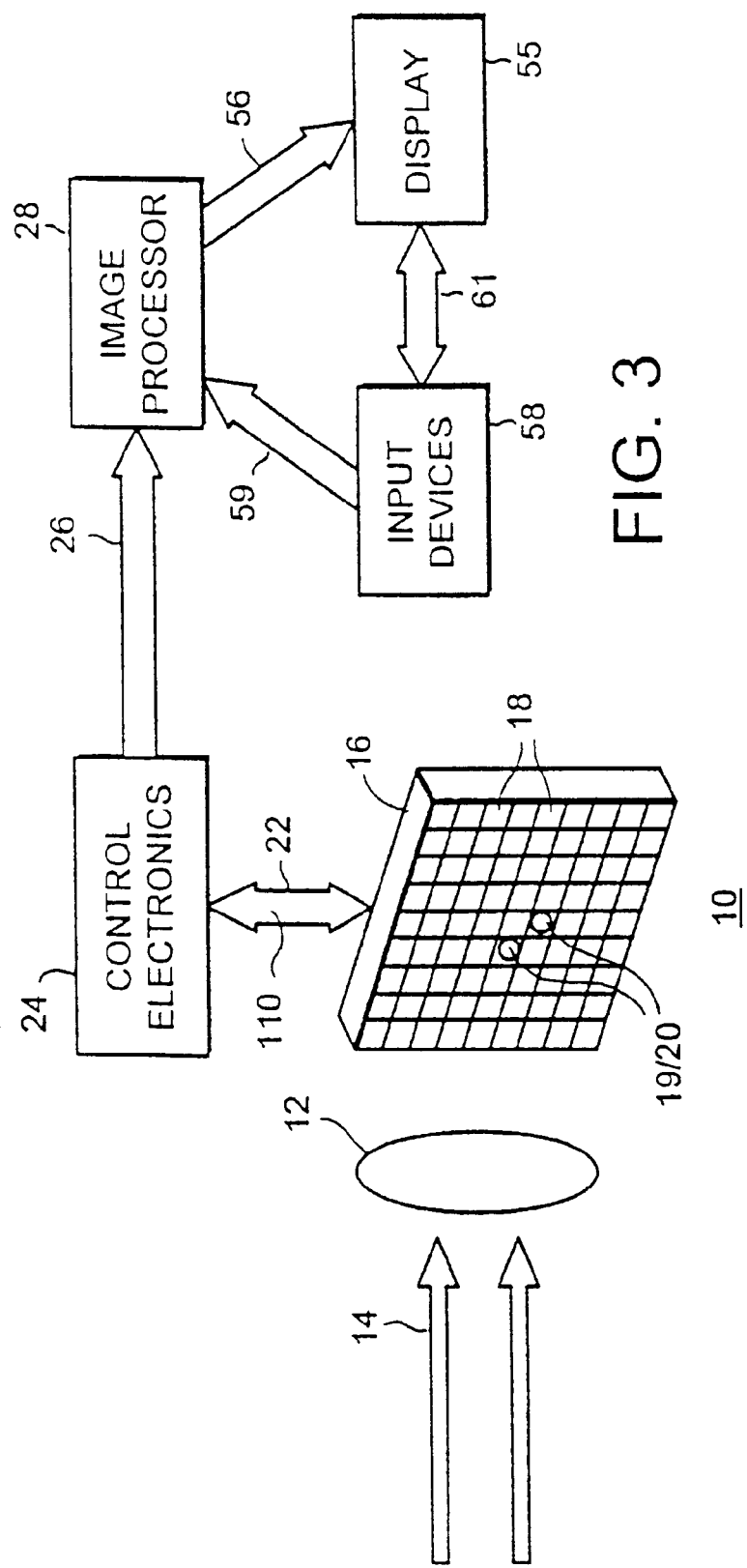
FIG. 3 is a schematic block diagram of an overall imaging configuration.

FIG. 3 is a schematic block diagram of an example of an imaging system suitable for use with the present invention. This particular embodiment is directed to the imaging of high energy radiation, for example X-ray radiation. By high energy radiation is meant radiation having an energy in excess of approximately 1 KeV. However, the invention is by no means limited to high energy radiation such as X-rays but could be applied to the detection of any particular radiation, for example γ-ray, β-ray, α-ray, infra-red or optical radiation, subject to an appropriate choice of semiconductor substrate.

The imaging system 10 of FIG. 3 is shown to provide imaging of an object 12 subject to radiation 14. In this example the radiation may, for example, be X-ray radiation as mentioned above, but could alternatively be γ-ray, β-ray or α-ray radiation. The object 12 may, for example, be part of a human body. The imaging device 16 comprises a plurality of image elements (here elements 18 of a two dimensional image element array). In the following, reference will be made to image elements 18, although it will be appreciated that in other embodiments the individual image elements may have a configuration other than that of an element within a two dimensional array (eg a strip arrangement).

Control electronics 24 includes processing and control circuitry for controlling the operation of the imaging device, or an array of imaging devices. The control electronics 24 is interfaced to the imaging device 16 via path 22 and enables the readout circuits 20 associated with individual image elements 18 to be addressed (e.g. scanned) for reading out charge from the readout circuits 20 at the individual image elements 18. The charge readout is supplied to Analogue-to-Digital Converters (ADCs) for digitisation and Data Reduction Processors (DRPs) for processing the digital signal. A bias 110 for the imaging device may also be applied over interface 22. Optionally, the bias may be applied via some other path.

The control electronics 24 is further interfaced via a path represented schematically by the arrow 26 to an image processor 28. The image processor 28 includes data storage in which it stores digital values representative of the charge values read from each image element along with the position of the image element 18 concerned. The image processor 28 builds up an image for display. It then reads the values stored for the selected image element positions to cause a representation of the data to be displayed on a display 55 via a path represented schematically by the arrow 56. The data can, of course, be printed rather than, or in addition to, being displayed and can be subjected to further processing operations. Input devices 58, for example, a keyboard and/or other typical computer input devices, are provided for controlling the image processor 28 and the display 55 as represented by the arrows 59 and 61.

The imaging device detects directly high energy incident radiation and accumulates at each image element, a count of the incident radiation hits at that image element.

The imaging device can be configured as a single semiconductor substrate (eg, of silicon) with each image element comprising an image element detector 19 and image element circuitry 20. Alternatively, the imaging device 16 can be configured on two substrates, one with an array of image element detectors and one with an array of corresponding image element circuits 20, the substrates being mechanically connected to each other by, for example, conventional bump-bonding technology or any other appropriate technology.

Figure 4:
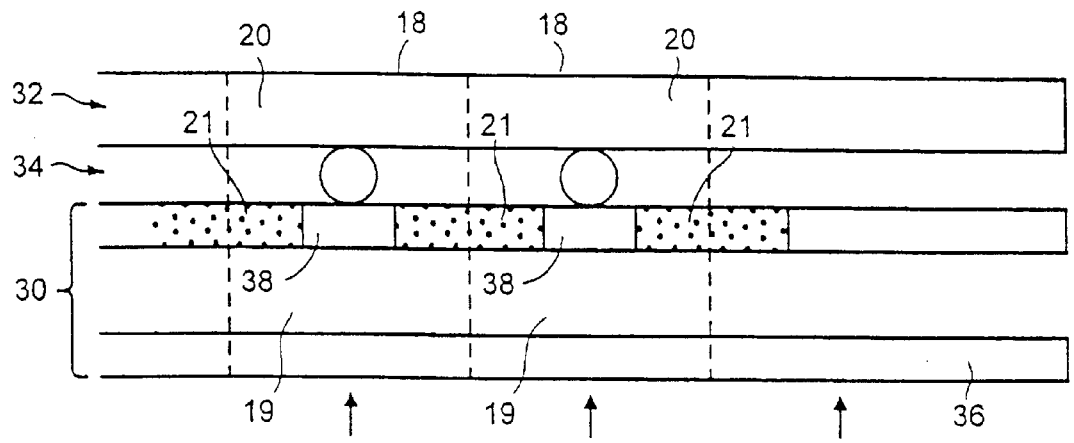
FIG. 4 is a cross-section of one example of an imaging device.

FIG. 4 is a schematic cross section of part of an imaging device 16. In this example, the imaging device 16 comprises an image detector substrate 30 connected to an image circuit substrate 32 by means of bump-bonds 34. An image element detector 19 of each image element 18 is defined on the detector substrate 30 by a continuous electrode 36 which applies a biasing voltage and image element location electrodes 38 to define a detection zone for the image element 18. Corresponding image element circuits 20 on the image circuit substrate 32 are defined at locations corresponding to the electrodes 38 (i.e. to the image element detectors 19). The image element circuits 20 are electrically connected to the corresponding electrodes 38 by bump-bonds 34. In this manner, when charge is generated in an image element detector 19 in response to incident radiation, this charge is passed via the bump-bond 34 to the corresponding image element circuit 20.

A continuous electrode 36 may be fabricated from suitably conductive material such as gold, indium/platinum alloy or platinum/gold alloy, for example. The image element electrodes may be fabricated from a conductive material such as gold, platinum/gold alloy or nickel/gold alloy, for example.

Thus, each image element 18 of the imaging device 16 is in effect defined on the substrate by electrodes 38 which apply a biasing voltage in cooperation with continuous electrodes 36 to define a detection zone (i.e. the image element detector 19) for the image element 18. Corresponding readout circuits on the readout substrate can comprise, for example, active image element circuits 20 as described in the aforementioned WO 95/33332. The image element detectors 19 are formed with a detection zone such that, when a photon is photo-absorbed in the semiconductor substrate 30 at an image element 18 creating an electric charge or when a charged radiation ionises the detection zone of the semiconductor substrate 30 at an image element 18, an electric pulse flows from the semiconductor detection zone to the readout circuit 20 for that image element 18 through the solder bump 34 for that image element.

The actual size of the image element circuit and the image element detector will depend on the application for which the imaging device is intended.

As mentioned above, the image element detectors and image element circuits could be constructed integrally on a single semiconductor substrate. Such an implementation is possible, but sets challenges unrelated to the present invention, relating to circuit manufacturing techniques. With suitable circuit manufacturing techniques, the invention as described herein is perfectly applicable to implementation on a single semiconductor substrate, as opposed to the dual-substrate technique described herein.

Any appropriate semiconductor materials can be used for the substrates. For example, silicon may be used for the detector substrate and for the image circuit substrate. Other semiconductor materials could be used. For example, for the detector substrate, the material could be selected from: CdZnTe, CdTe, $HgI_2$, InSb, GaAs, Ge, TlBr, Si and PbI.

By way of example, for a detector substrate material of CdZnTe the continuous electrode 36 is typically held at a voltage in the range of −100V to −600V relative to a reference voltage, whilst for CdTe, the voltage is +/−100V to +/−600V. An electric field of approximately ±200V/mm is applied between the continuous electrode 36 and image element electrodes 38 which are biased with −/+5V or +3V. For a silicon detector substrate an electric field of +150V/0.5 mm is applied between the continuous electrode 36 and image element electrodes 38.

When an X-ray photon is photo-absorbed in a detection zone of image element detector 19 an electric charge is created, (or charged particle or gamma-ray is incident or absorbed for other embodiments) an electric pulse flows from image element detector 19 via the bump-bonds 34 to corresponding image element circuitry 20.

In an illustrative example of an imaging system in accordance with an embodiment of the present invention, the imaging device detector comprises imaging elements of 100×100 $\mu m^2$ size and having a uniform size across the whole of the imaging device area. The total number of imaging device elements is 108×108 giving 19 440 image elements. The individual dimension of each imaging device is 10.8×18.0 $mm^2$. The substrate material is preferably CdZnTe, or may be CdTe or Si. The dimensions of the substrate material are 12.9×21.4×0.075 mm for CdZnTe. The bias electrode comprises a continuous metallisation of platinum/gold sputtered on to the substrate material. The detector elements comprise nickel-gold detector contacts with 50×50 $\mu m^2$ contact area to the CdZnTe surface. The contact size is preferably selected so that charge selection is maximise without reducing inter-element resistivity adversely.

In accordance with the described example, the imaging device comprises a separate detector substrate and read-out chip utilising CMOS technology. The read-out chip comprises 108×180 read-out cells. Each cell size is approximately 50×50 $\mu m^2$ which provides sufficient area for control logic between the cells, such logic being disposed between individual detector elements so that they can be placed as close to the edge of the chips as possible, thereby allowing seamless tiling.

Preferably, the majority of the image element area is occupied by a charge storing capacitor coupled to the gate of a transistor for each detector element, the capacitance for each detector element being in the region of 3 pf per element. The elements are adapted to provide a programmable resolution of 100, 200 or 400 $\mu m$. The read-out chip wafer thickness is preferably 0.5 mm. Preferably, the pads for bump bonding disposed on the read-out chip with the detector are disposed such that the size of the pad holes is as large as possible in order to maximise the bump process yield. Eighteen output pads for wire bonding to the tile PCB are also provided.

As referred to above, the described example utilises detector tiles. In the present example, a detector tile comprises a detector substrate bump bonded to a CMOS read-out chip, the chip being electrically and mechanically coupled to a PCB. The tile PCB comprises five detector/read-out modules disposed side-by-side on one side of the PCB. The read-out modules are wire bonded to input/output pads on the read-out chip. The tile PCB is mounted to an analogue module (described hereinafter) by M2 metal screws. Spring contacts are provided on the underside of the tiles PCB in order to provide electrical contact between the tile PCB and the analogue module when the fixing screws are tightened. A fibreglass spacer is disposed between the tiles PCB and the analogue module in order to inhibit the tile PCB from bending when the fixing screws are tightened.

Figure 5:
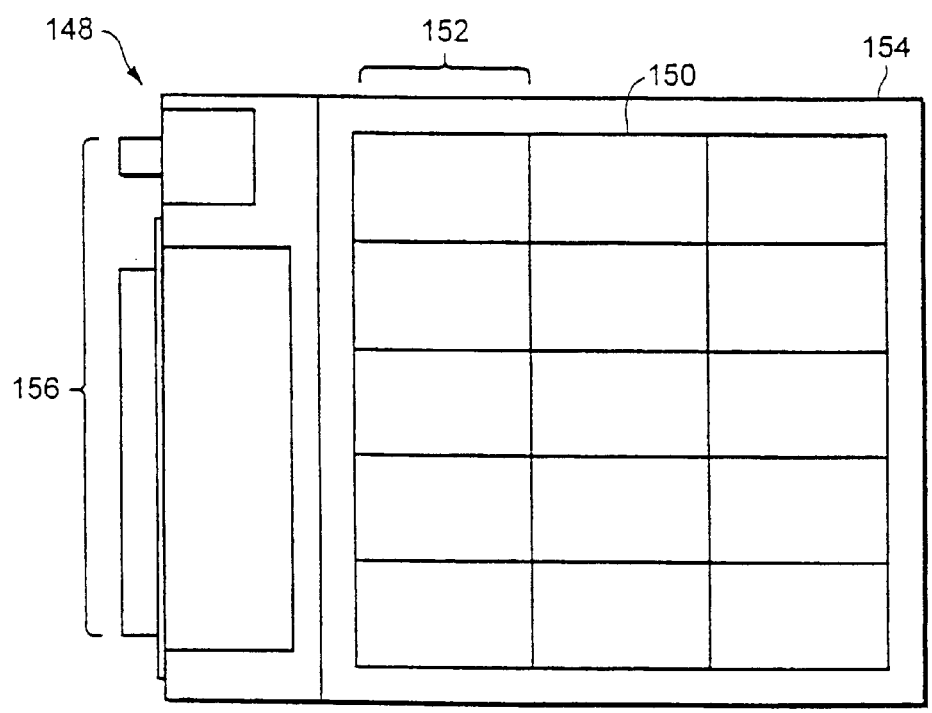
FIG. 5 is a schematic diagram of an image element circuit in accordance with an embodiment of the invention.

Referring now to FIG. 5, there is illustrated an imaging device tile cassette 148 having 15 tiles arranged in a 3×5 array. The 3×5 array is labelled 150 in FIG. 5. Each column of 5 device tiles 152, in the 3×5 array 150 is supported on a tile PCB and comprises 5 image element detector/CMOS modules. The tile PCBs are supported on an analogue module circuit board 154. Input/output circuitry, power, control and bias lines are coupled to the analogue circuitry module by means of a connector 156. With regard to connector 156, the analogue module need not be directly connected thereto, but may be connected by means of further coupling elements.

Figure 6:
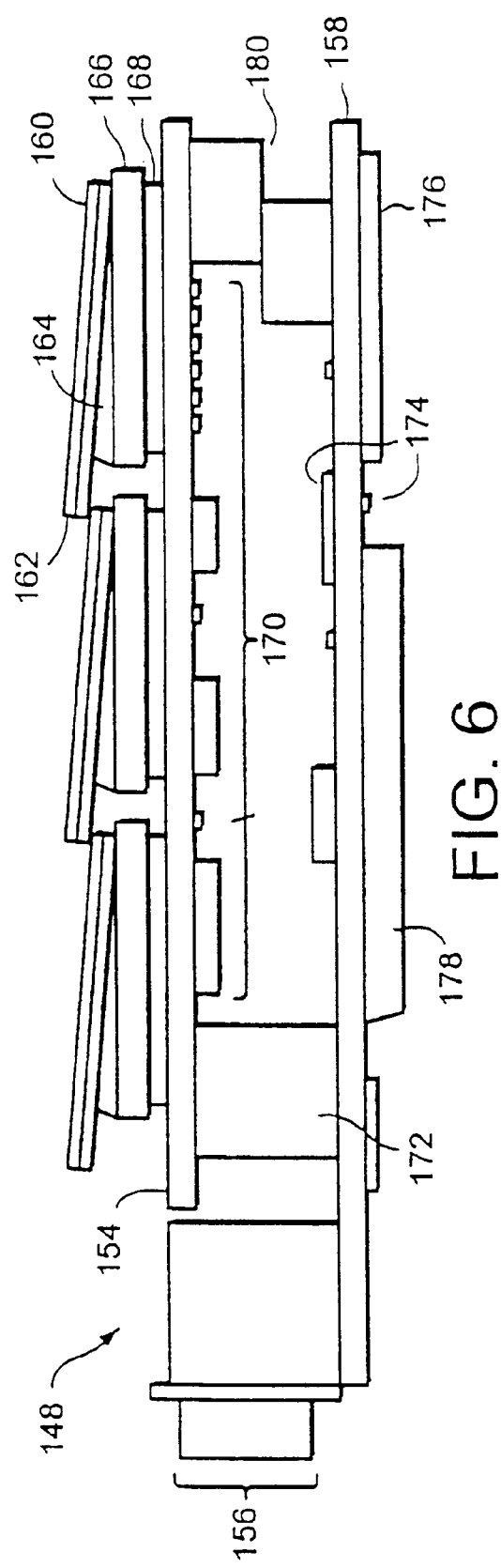
FIG. 6 is a schematic diagram of another example of an image element circuit for a further embodiment of the invention.
Figure 7:
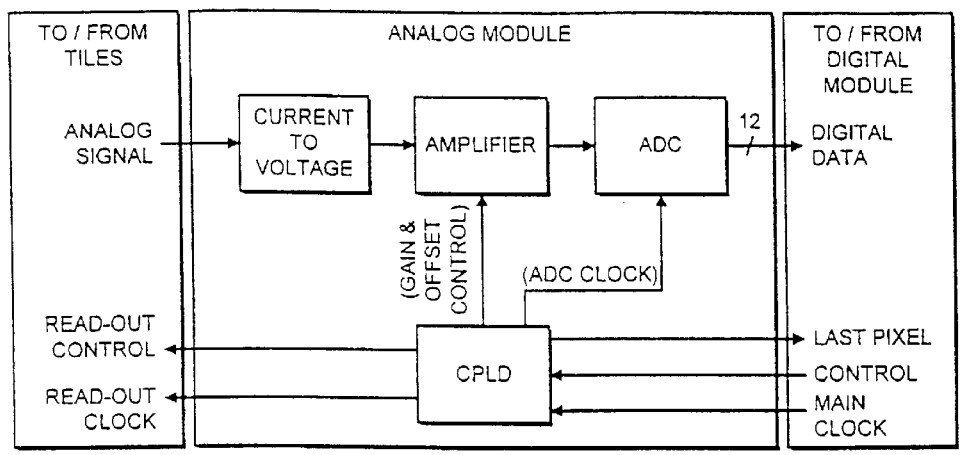
FIG. 7 is a schematic diagram showing analogue components forming part of the analogue circuit board shown in FIG. 6.
Figure 8:
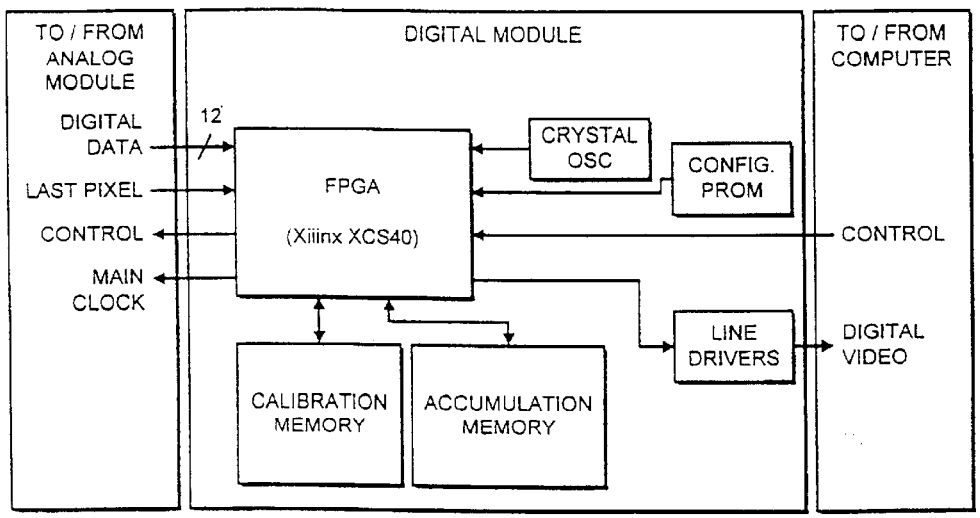
FIG. 8 is a schematic diagram showing digital components forming part of the digital circuit board shown in FIG. 6.

Referring now to FIG. 6, there is illustrated a side view of an imaging device tile cassette 148. In accordance with a preferred embodiment of the invention, the electronic circuitry for the imaging device tile cassette 148 is divided between two circuit boards 154 and 158. Circuit board 154 preferably comprises at least all the analogue electronics for the imaging device tiles supported thereon. Circuit board 158 comprises the digital electronics for controlling imaging acquisition and read-out and resetting of the imaging device tiles. Other circuitry, such as further analogue circuitry may be disposed on circuit board 158, and digital electronics may be supported on circuit board 154. The particular configuration is dependent upon the size and constraints presented by a particular embodiment and the invention is not limited to the described arrangement.

Each image element detector substrate 160 comprises CdZnTe or CdTe or Si for example and is bump bonded to CMOS circuitry 162 on its underside. As previously described, the image element substrate may comprise a unitary substrate having the detector on one side of the semiconductor material, and circuitry on its underside. A wedge 164 tilts the image element detector substrate/CMOS (imaging device) 160, 162 in order that it may overlap an inactive area of an adjacent imaging device unit to provide continuous imaging. The wedge 164 is supported by a tile PCB 166. The tile 166 may be a discrete element comprising a single detector substrate and read out chip, or may comprise more than one detector substrate and read-out chip disposed on a tile PCB 166. The tile PCB is supported on the analogue circuit board 154. In between the tile PCB 166 and the analogue circuit board 154 is disposed a substrate 168 comprising holes for supporting spring contacts for electrical contacting between the tile PCB and analogue circuit board. The analogue circuit board 154 comprises at least the analogue electronics for the imaging devices, and the electronics are supported on the underside of circuit board 154 and labelled 170 by way of a 36 pin circuit board to circuit board connector 172.

Circuit board 154 is electrically and mechanically coupled to circuit board 158.

Preferably circuit board 158 is a four layer double sided circuit board, for example. Typically, circuit board 158 comprises the digital electronics and has circuit elements 174 distributed in both its upper and lower sides. For example, on the lower side the digital elements comprise a memory unit 176 and a field programmable gate array 178. As illustrated in FIG. 6, the circuit board connector and bias supply connector 156 is coupled to the circuit board 158 with suitable conductive leads being disposed on circuit board 158 to electrically couple circuit board to circuit board connector 172 to connector 156. The circuit board to circuit board connector 172 both electrically couple the analogue circuit board 154 to circuit board 158 and mechanically supports it. A further mechanical support or supports 180 may be provided elsewhere between the circuit boards.

In an optional embodiment, a cassette housing may be provided for the imaging device tile cassette 148 in order to protect and support the tile cassette. Grooves may be provided on inside walls of the housing into which one or other or both circuit board 154, 158 edges may be placed for mechanically supporting the circuit board separately from each other.

The electronic circuitry 170 disposed on circuit board 154, and circuit board 154 itself is preferably substantially the same surface area as the imaging device 150, in order to reduce non-imaging surface area when viewed from the imaging device side. preferably, at least 70% of the surface area of circuit board 154 overlaps the surface area of imaging device 150.

Similarly, circuit board 158 is constrained within the peripheral boundaries of the imaging device 150 and/or circuit board 154. Preferably, the overlap of circuit board 158 with the imaging device 150 and/or circuit board 154 is at least 70%.

Typically, about 90% overlap is achievable due to the need to provide space for circuit board connectors.

In view of the foregoing description it will be evident to a person skilled in the art that various modifications may be made within the scope of the invention. For example, embodiments of the invention need not be limited to a first and second substrate, but may comprise three or more substrates for supporting further electronics. Additionally, the substrates may be of any suitable material such as ceramic material for example, not necessarily glass fibre material.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived therefrom. In particular, with reference to the appended claims, features from dependent claims may be combined with those of the independent claims and features from respective independent claims may be combined in any appropriate manner and not merely in the specific combinations enumerated in the claims.

What is claimed is:

1. A radiation imaging assembly, including:
a radiation imaging detector including a plurality of image elements from which respective signals may be produced and a plurality of contacts;
a first substrate comprising first and second major faces, said first major face being arranged to support said radiation imaging detector and including support contacts for cooperating with respective contacts of said radiation imaging detector when said detector is supported by said first major face said second major face being arranged to support electronic circuitry operable with said radiation imaging detector; and
a second substrate for supporting electronic circuitry operable with said radiation imaging detector,
wherein said second substrate is disposed opposing said second major face of said first substrate.

2. A radiation assembly according to claim 1, wherein said second substrate is disposed confronting said second major face of said first substrate.

3. A radiation assembly according to claim 2, wherein said second substrate is disposed substantially within the peripheral boundaries of said second major face of said first substrate.

4. A radiation imaging assembly according to claim 3, wherein said second substrate is located substantially within the footprint of said second major face of said first substrate.

5. A radiation imaging assembly according to claim 1, wherein said second substrate is disposed relative to said first substrate such that at least about 70% of the surface area of said second substrate overlaps with the surface area of said second major face of said first substrate.

6. A radiation imaging assembly according to claim 1, the detector comprising an imaging device tile supporting an imaging device, the imagine device comprising a plurality of image elements from which respective signals may be produced and a plurality of contacts at respective tile contact positions on a mounting surface of said tile, wherein the plurality of contacts is for carrying at least supply, control and output signals, and
said first major face including support contacts for carrying at least supply, control and output signals, and for cooperating with respective contacts of said imaging device tile when said tile is mounted on said first major face.

7. A radiation imaging assembly according to claim 1, wherein said electronic circuitry supported by said second major face comprises analogue signal processing circuitry.

8. A radiation imaging assembly according to claim 7, wherein said analogue signal processing circuitry comprises a current to voltage converter for converting signals from said radiation imaging detector or imaging device tile.

9. A radiation imaging assembly according to claim 8, wherein said analogue signal processing circuitry comprises an analogue-to-digital converter, arranged to receive signals from said current to voltage converter.

10. A radiation imaging assembly according to claim 3, wherein said electronic circuitry supported by said second substrate comprises digital circuitry.

11. A radiation imaging assembly according to claim 10, wherein said digital electronic circuitry is adapted to process signals form electronic circuitry supported by said second major face so as to provide control and readout signals for control and read out of said imaging detector.

12. A radiation imaging assembly according to claim 1, including a circuit to circuit board connector arranged to mechanically support and separate said first and second substrates.

13. A radiation imaging assembly according to claim 1, including a spacer arranged to mechanically support and separate said first and second substrates.

14. A housing for an assembly according to claim 1, said housing comprising mechanical support means for said assembly.

15. A housing according to claim 14, said mechanical support means comprising at least one groove in a side of said housing for receiving an edge of said first or second substrate.

* * * * *

UNITED STATES PATENT AND TRADEMARK OFFICE
CERTIFICATE OF CORRECTION

PATENT NO. : 6,703,617 B1  Page 1 of 1
APPLICATION NO. : 09/958923
DATED : March 9, 2004
INVENTOR(S) : Spartiotis et al.

It is certified that error appears in the above-identified patent and that said Letters Patent is hereby corrected as shown below:

| Column | Line | |
|---|---|---|
| 6 | 17 | Change "95/33332" to --95/33332--. |
| 7 | 8 | Change "maximise" to --maximised--. |
| 7 | 25 | Change "0.5" to --0.5--. |
| 10 | 28 | Change "claim 3" to --claim 1--. |

Signed and Sealed this

Twenty-fifth Day of September, 2007

JON W. DUDAS
*Director of the United States Patent and Trademark Office*